United States Patent
Lim et al.

(10) Patent No.: US 10,629,543 B2
(45) Date of Patent: Apr. 21, 2020

(54) PACKAGE SUBSTRATES HAVING AN ELECTROMAGNETIC BANDGAP STRUCTURE AND SEMICONDUCTOR PACKAGES EMPLOYING THE PACKAGE SUBSTRATES

(71) Applicant: SK hynix Inc., Icheon-si, Gyeonggi-do (KR)

(72) Inventors: Sung Mook Lim, Icheon-si (KR); Hye Won Kim, Ansan-si (KR); Won Duck Jung, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/236,058

(22) Filed: Dec. 28, 2018

(65) Prior Publication Data

US 2019/0393164 A1     Dec. 26, 2019

(30) Foreign Application Priority Data

Jun. 26, 2018 (KR) .......................... 10-2018-0073623

(51) Int. Cl.
    *H01L 23/552*      (2006.01)
    *H01L 23/66*      (2006.01)
    *H01L 23/522*      (2006.01)
    *H01L 23/00*      (2006.01)

(52) U.S. Cl.
CPC ........ *H01L 23/552* (2013.01); *H01L 23/5223* (2013.01); *H01L 23/5226* (2013.01); *H01L 23/66* (2013.01); *H01L 24/09* (2013.01); *H01L 24/49* (2013.01); *H01L 2223/6616* (2013.01); *H01L 2223/6672* (2013.01)

(58) Field of Classification Search
CPC .............. H01L 23/552; H01L 23/5223; H01L 23/5226; H01L 23/66; H01L 24/09; H01L 24/49; H01L 2223/6616; H01L 2223/6672
USPC ........................................ 257/728
See application file for complete search history.

(56) References Cited

U.S. PATENT DOCUMENTS 9,148,947 B2 *   9/2015   Tang .................... H05K 1/0224
2008/0277153 A1    11/2008   Teshome et al.

* cited by examiner

*Primary Examiner* — Tu-Tu V Ho
(74) *Attorney, Agent, or Firm* — William Park & Associates Ltd.

(57) ABSTRACT

A package substrate includes a core layer including a first surface and a second surface, which are opposite to each other. The package substrate also includes a power plane interconnection layer disposed on the first surface of the core layer and a ground plane interconnection layer disposed on the second surface of the core layer. The package substrate additionally includes an electromagnetic (EM) bandgap structure disposed in the core layer and electrically coupled between the power plane interconnection layer and the ground plane interconnection layer. The EM bandgap structure includes an EM bandgap via protruding from a portion of the power plane interconnection layer toward the ground plane interconnection layer. The EM bandgap structure further includes an EM bandgap cylindrical structure extending from a portion of the ground plane interconnection layer toward the power plane interconnection layer and surrounding a side surface of the EM bandgap via.

17 Claims, 10 Drawing Sheets

PACKAGE SUBSTRATES HAVING AN ELECTROMAGNETIC BANDGAP STRUCTURE AND SEMICONDUCTOR PACKAGES EMPLOYING THE PACKAGE SUBSTRATES

CROSS-REFERENCE TO RELATED APPLICATIONS

The present application claims priority under 35 U.S.C. 119(a) to Korean Application No. 10-2018-0073623, filed on Jun. 26, 2018, which is incorporated herein by references in its entirety.

BACKGROUND

1. Technical Field

Various embodiments of the present disclosure generally relate to package substrates and semiconductor packages employing the same and, more particularly, to package substrates having an electromagnetic (EM) bandgap structure and semiconductor packages employing the same.

2. Related Art

Recently, electronic systems, such as personal digital assistants (PDAs), mobile phones, liquid crystal display (LCD) panels, and laptop computers, have become smaller, thinner, and/or lighter. Accordingly, semiconductor devices, as well as other components used in the electronic systems, have been developed to be smaller, lighter, better performing and highly integrated components. Moreover, at least two different packages, for example, an analog package and a digital package, may be mounted adjacent to one another on the same substrate, or at least two semiconductor devices may be mounted in a single package to provide a compact package.

SUMMARY

According to an embodiment, a package substrate includes a core layer including a first surface and a second surface, which are opposite to each other. The package substrate also includes a power plane interconnection layer disposed on the first surface of the core layer and a ground plane interconnection layer disposed on the second surface of the core layer. The package substrate additionally includes an electromagnetic (EM) bandgap structure disposed in the core layer and electrically coupled between the power plane interconnection layer and the ground plane interconnection layer. The EM bandgap structure includes an EM bandgap via protruding from a portion of the power plane interconnection layer toward the ground plane interconnection layer. The EM bandgap structure further includes an EM bandgap cylindrical structure extending from a portion of the ground plane interconnection layer toward the power plane interconnection layer and surrounding a side surface of the EM bandgap via.

According to another embodiment, a package substrate includes a first core layer, a second core layer, a ground plane interconnection layer disposed between the first core layer and the second core layer, a first power plane interconnection layer disposed on a top surface of the first core layer, and a second power plane interconnection layer disposed on a bottom surface of the second core layer opposite to the first core layer. The package substrate also includes a first EM bandgap structure disposed in the first core layer and electrically coupled between the first power plane interconnection layer and the ground plane interconnection layer. The package substrate also includes a second EM bandgap structure disposed in the second core layer and electrically coupled between the second power plane interconnection layer and the ground plane interconnection layer. The first EM bandgap structure includes a first EM bandgap via protruding from a portion of the first power plane interconnection layer toward the ground plane interconnection layer and a first EM bandgap cylindrical structure extending from a portion of the ground plane interconnection layer toward the first power plane interconnection layer and surrounding a side surface of the first EM bandgap via. The second EM bandgap structure includes a second EM bandgap via protruding from a portion of the second power plane interconnection layer toward the ground plane interconnection layer and a second EM bandgap cylindrical structure extending from a portion of the ground plane interconnection layer toward the second power plane interconnection layer and surrounding a side surface of the second EM bandgap via.

According to another embodiment, a semiconductor package includes a package substrate, a chip mounted on the package substrate, and a molding member disposed on a surface of the package substrate to cover the chip. The package substrate includes a core layer having a first surface and a second surface opposite to the first surface, a power plane interconnection layer disposed on the first surface of the core layer, and a ground plane interconnection layer disposed on the second surface of the core layer, and at least one EM bandgap structure disposed in the core layer and electrically coupled between the power plane interconnection layer and the ground plane interconnection layer. The at least one EM bandgap structure includes an EM bandgap via protruding from a portion of the power plane interconnection layer toward the ground plane interconnection layer and an EM bandgap cylindrical structure extending from a portion of the ground plane interconnection layer toward the power plane interconnection layer and surrounding a side surface of the EM bandgap via.

According to another embodiment, a semiconductor package includes a package substrate, a chip mounted on the package substrate, and a molding member disposed on a surface of the package substrate to cover the chip. The package substrate includes a first core layer, a second core layer, a ground plane interconnection layer disposed between the first core layer and the second core layer, a first power plane interconnection layer disposed on a top surface of the first core layer, a second power plane interconnection layer on a bottom surface of the second core layer opposite to the first core layer, at least one first EM bandgap structure disposed in the first core layer and electrically coupled between the first power plane interconnection layer and the ground plane interconnection layer, and at least one second EM bandgap structure disposed in the second core layer and electrically coupled between the second power plane interconnection layer and the ground plane interconnection layer. The at least one first EM bandgap structure includes a first EM bandgap via protruding from a portion of the first power plane interconnection layer toward the ground plane interconnection layer and a first EM bandgap cylindrical structure extending from a portion of the ground plane interconnection layer toward the first power plane interconnection layer and surrounding a side surface of the first EM bandgap via. The at least one second EM bandgap structure includes a second EM bandgap via protruding from a portion of the second power plane interconnection layer toward the ground plane interconnection layer and a second EM bandgap cylindrical structure extending from a portion of the ground plane interconnection layer toward the second power plane interconnection layer and surrounding a side surface of the second EM bandgap via.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION OF THE EMBODIMENTS

For the following description of embodiments, it will be understood that the terms "first" and "second" are intended to identify an element, but are not used to define the element itself or imply a particular sequence or hierarchy. In addition, when an element is referred to as being located "on," "over," "above," "under," or "beneath" another element, a relative positional relationship is indicated, regardless of the presence or absence of intervening elements. Accordingly, the terms such as "on," "over," "above," "under," "beneath," "below," and the like that are used herein are for the purpose of describing particular embodiments only and are not intended to limit the scope of the present disclosure. Further, when elements are referred to as being "connected" or "coupled" to one another, the elements may be electrically or mechanically connected or coupled directly without intervening elements or indirectly with intervening elements.

Various embodiments are directed to package substrates having an electromagnetic (EM) bandgap structure and to semiconductor packages employing the same.

Switching noises generated in a digital circuit operating at a high speed may be propagated through a power plane and a ground plane. In such case, a power/ground network may resonate at a specific frequency, and the power/ground network may have a relatively low impedance value at the specific frequency. If the resonant frequency of the power/ground network is equal or close to an operation frequency of a system including the power/ground network, a fluctuation phenomenon of a power voltage may occur to cause substantial simultaneous switching noise (SSN), even if a small switching current flows in the system. This may lead to a malfunction of the system or may affect the operation of an analog circuit included in the system. The simultaneous switching noise (SSN) may cause a noise coupling phenomenon of adjacent signal lines or an adjacent system and may cause EM interference (EMI). Accordingly, when the power/ground network is designed, it may be necessary to reduce the impedance of the power ground network in a low frequency band to suppress occurrence of the noise at a high frequency. Various embodiments of the present disclosure may provide package substrates which are capable of lowering a resonant frequency of the power/ground network to reduce noise at a high frequency, by installing an EM bandgap structure coupled between a power plane and a ground plane disposed in each of the package substrates.

Figure 1:
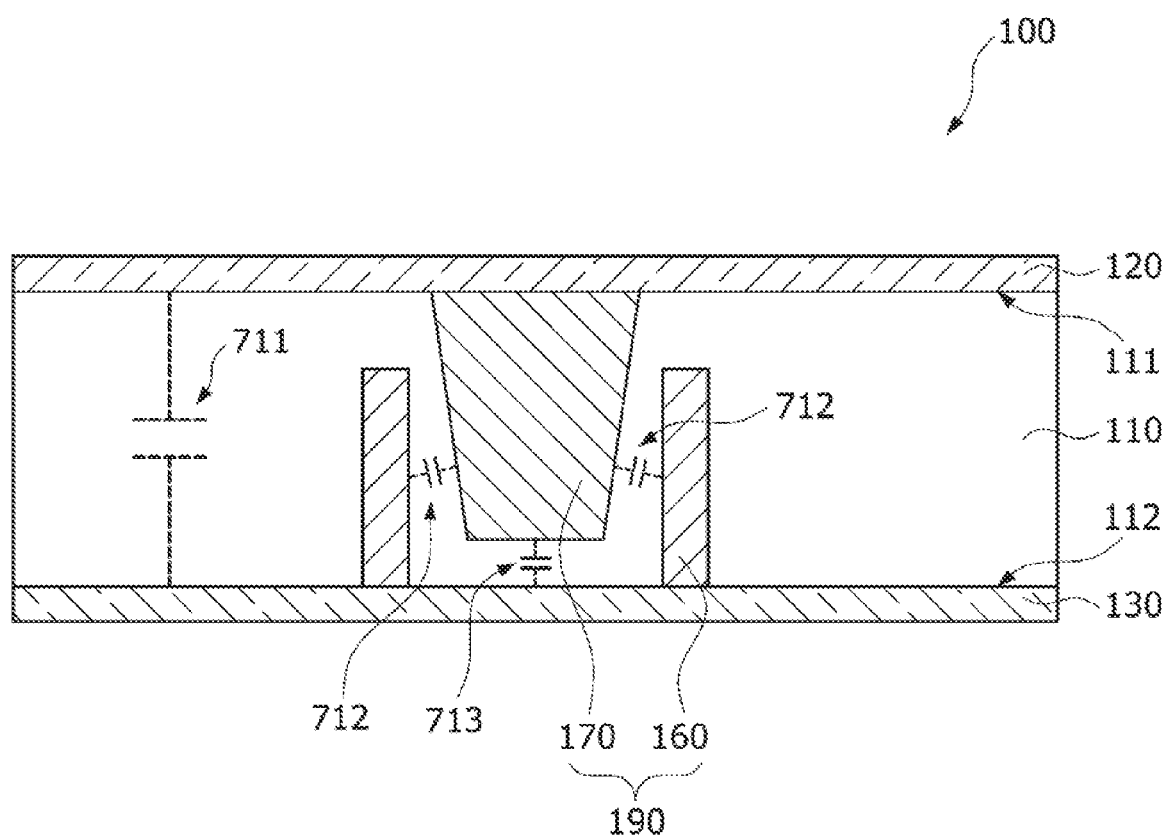
FIG. 1 shows a cross-sectional view illustrating a package substrate, according to an embodiment of the present disclosure.
Figure 2:
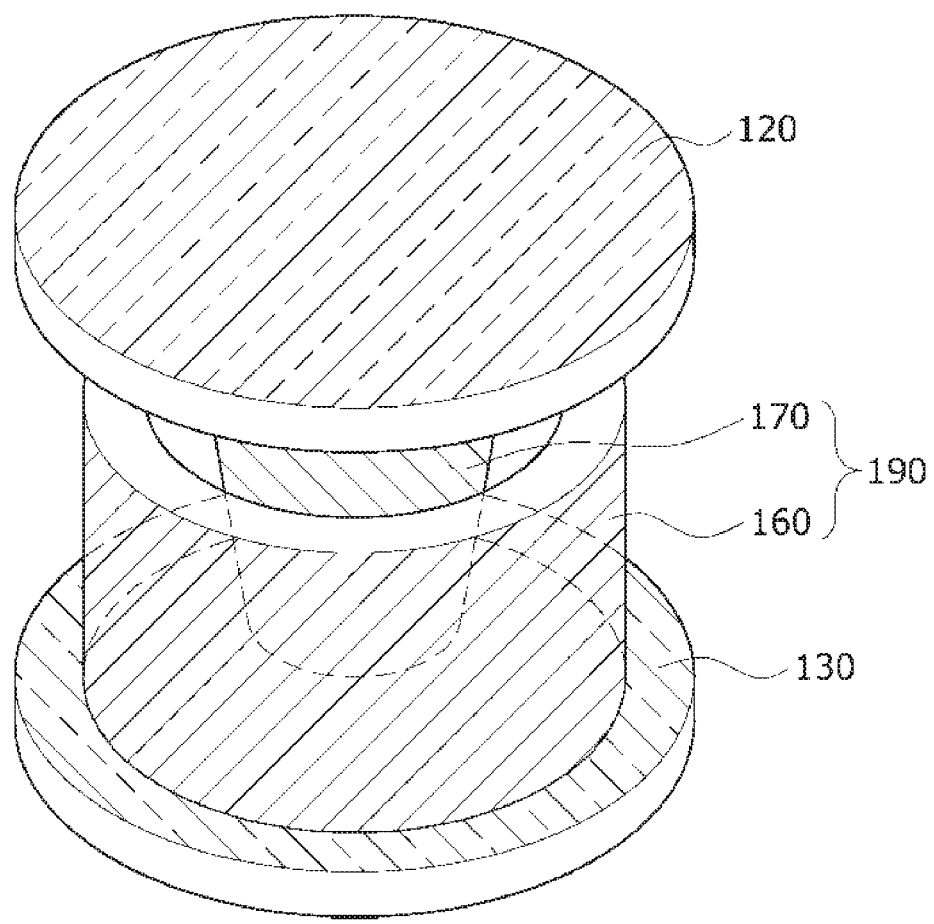
FIG. 2 shows a perspective view illustrating an EM bandgap structure of the package substrate shown in FIG. 1.

FIG. 1 shows a cross-sectional view illustrating a package substrate 100, according to an embodiment of the present disclosure, and FIG. 2 shows a perspective view illustrating an EM bandgap structure of the package substrate 100 shown in FIG. 1. Referring to FIGS. 1 and 2, the package substrate 100 may have an interconnection structure including at least two layers. The package substrate 100 may include a core layer 110, a power plane interconnection layer 120, a ground plane interconnection layer 130, and an EM bandgap structure 190. The core layer 110 may be an insulation layer. The core layer 110 may have a first surface 111 and a second surface 112, which are opposite to each other. The power plane interconnection layer 120 and the ground plane interconnection layer 130 constituting the interconnection structure represent at least two layers that may be disposed on the first surface 111 and the second surface 112 of the core layer 110, respectively. Although not shown in FIG. 1, one solder resist layer may be disposed on a surface of the power plane interconnection layer 120 opposite to the core layer 110, and another solder resist layer may be disposed on a surface of the ground plane interconnection layer 130 opposite to the core layer 110. In an embodiment, the power plane interconnection layer 120 and the ground plane interconnection layer 130 may be conductive layers, such as metal layers. The power plane interconnection layer 120 may transmit a power voltage, and the ground plane interconnection layer 130 may transmit a ground voltage. In an embodiment, the power plane interconnection layer 120 and the ground plane interconnection layer 130 may be disposed in parallel along the first and second surfaces 111 and 112 of the core layer 110 to vertically overlap with each other. The term "overlap," as used herein, can mean to both partially overlap or fully overlap for different embodiments. Thus, the power plane interconnection layer 120, the ground plane interconnection layer 130, and the core layer 110 therebetween may constitute a parasitic capacitive component 711.

The EM bandgap structure 190 may be disposed in the core layer 110 located between the power plane interconnection layer 120 and the ground plane interconnection layer 130. The EM bandgap structure 190 may be configured to include an EM bandgap cylindrical structure 160 and an EM bandgap via 170. Each of the EM bandgap cylindrical structure 160 and the EM bandgap via 170 may include a conductive material, such as a metal material.

The EM bandgap cylindrical structure 160 may be disposed to extend from a top surface of the ground plane interconnection layer 130 toward a bottom surface of the power plane interconnection layer 120. The top surface of the ground plane interconnection layer 130 may be in contact with the second surface 112 of the core layer 110. The bottom surface of the power plane interconnection layer 120 may be in contact with the first surface 111 of the core layer 110. The EM bandgap cylindrical structure 160 may provide an opening hole defined by an inner side surface of the EM bandgap cylindrical structure 160. A bottom surface of the EM bandgap cylindrical structure 160 may directly contact the ground plane interconnection layer 130, and a top surface and side surfaces of the EM bandgap cylindrical structure 160 may be covered with the core layer 110.

The EM bandgap via 170 may be disposed to extend from the bottom surface of the power plane interconnection layer 120 toward the top surface of the ground plane interconnection layer 130. While the EM bandgap cylindrical structure 160 has a cylindrical shape, the EM bandgap via 170 may have a blind via shape. In an embodiment, the EM bandgap via 170 may correspond to a pillar having a round shape in a plan view and a reverse trapezoidal shape in a vertical cross-sectional view. A top surface of the EM bandgap via 170 may directly contact the power plane interconnection layer 120. A bottom surface and a side surface of the EM bandgap via 170 may be covered with the core layer 110. The EM bandgap via 170 may be disposed such that a portion of the EM bandgap via 170 is inserted into the opening hole defined by the EM bandgap cylindrical structure 160. That is, the inner side surface of the EM bandgap cylindrical structure 160 may surround the side surface of the EM bandgap via 170, and the core layer 110 may be disposed between the EM bandgap cylindrical structure 160 and the EM bandgap via 170. Thus, the EM bandgap via 170, the core layer 110, and the EM bandgap cylindrical structure 160 laterally overlap each other and may constitute a first EM bandgap capacitive component 712. In some embodiments, the EM bandgap cylindrical structure 160 completely surrounds the side surface of the EM bandgap via 170. In other embodiments, the EM bandgap cylindrical structure 160 only partially surrounds the side surface of the EM bandgap via 170. In addition, the EM bandgap via 170, the core layer 110, and the ground plane interconnection layer 130 vertically overlap each other and may constitute a second EM bandgap capacitive component 713. The first EM bandgap capacitive component 712, the second EM bandgap capacitive component 713, and the parasitic capacitive component 711 may be coupled in parallel to constitute a total capacitive component between the power plane interconnection layer 120 and the ground plane interconnection layer 130. Accordingly, the total capacitance value between the power plane interconnection layer 120 and the ground plane interconnection layer 130 may increase due to the presence of the first EM bandgap capacitive component 712 and the second EM bandgap capacitive component 713. That is, a three-dimensional capacitor may be realized using the EM bandgap cylindrical structure 160 and the EM bandgap via 170 to increase a capacitance value of a capacitive component between two electrodes respectively connected to the EM bandgap cylindrical structure 160 and the EM bandgap via 170 included in a semiconductor package having a limited form factor.

Figure 3:
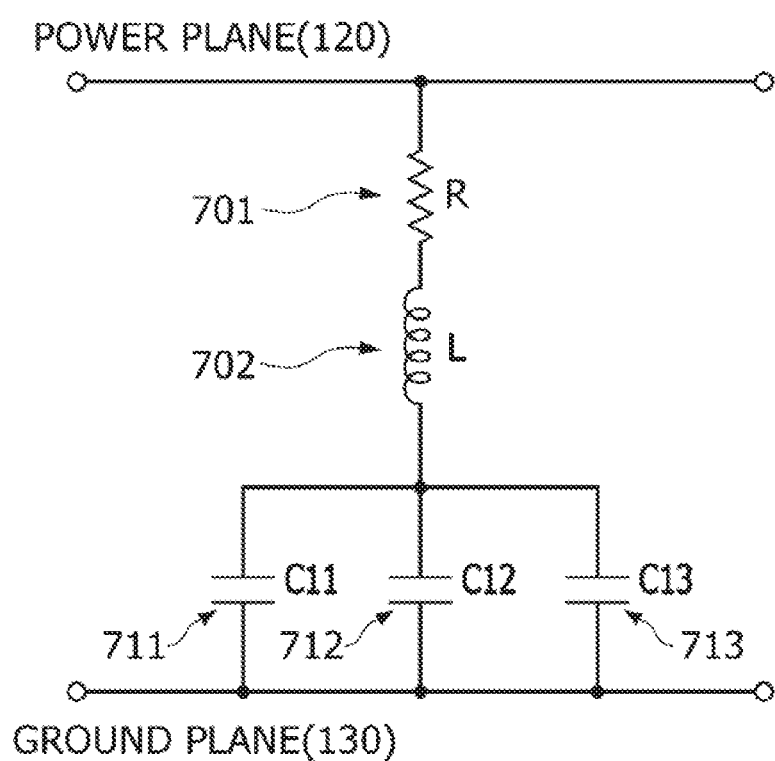
FIG. 3 shows an equivalent circuit diagram between a power line and a ground line of the package substrate shown in FIG. 1.

FIG. 3 shows an equivalent circuit diagram between a power line and a ground line of the package substrate 100 shown in FIG. 1. Referring to FIG. 3, an R-L-C serial circuit may be coupled between the power plane interconnection layer 120 and the ground plane interconnection layer 130. Specifically, a resistive component 701, an inductive component 702, and a capacitive component may be coupled in series between the power plane interconnection layer 120 and the ground plane interconnection layer 130. The capacitive component may include the parasitic capacitive component 711, the first EM bandgap capacitive component 712, and the second EM bandgap capacitive component 713, which are coupled in parallel. The resistive component 701 may include a resistive component of the power plane interconnection layer 120 and interconnection lines coupled to the power plane interconnection layer 120 as well as a resistive component of the ground plane interconnection layer 130 and interconnection lines coupled to the ground plane interconnection layer 130. The resistive component 701 may have a resistance value "R." The inductive component 702 may include an inductive component of the power plane interconnection layer 120 and interconnection lines coupled to the power plane interconnection layer 120 as well as an inductive component of the ground plane interconnection layer 130 and interconnection lines coupled to the ground plane interconnection layer 130. The inductive component 702 may have an inductance value "L." As described with reference to FIGS. 1 and 2, the capacitive component may be configured to include the parasitic capacitive component 711 having a capacitance value "C11," the first EM bandgap capacitive component 712 having a capacitance value "C12" and the second EM bandgap capacitive component 713 having a capacitance value "C13," which are coupled in parallel. Thus, a total equivalent capacitance value of the capacitive components may be expressed as "C11+C12+C13" corresponding to a sum of the capacitance value "C11," the capacitance value "C12" and the capacitance value "C13." That is, the total equivalent capacitance value of the capacitive components coupled between the power plane interconnection layer 120 and the ground plane interconnection layer 130 may increase by a sum of the capacitance value "C12" of the first EM bandgap capacitive component 712 and the capacitance value "C13" of the second EM bandgap capacitive component 713.

Figure 4:
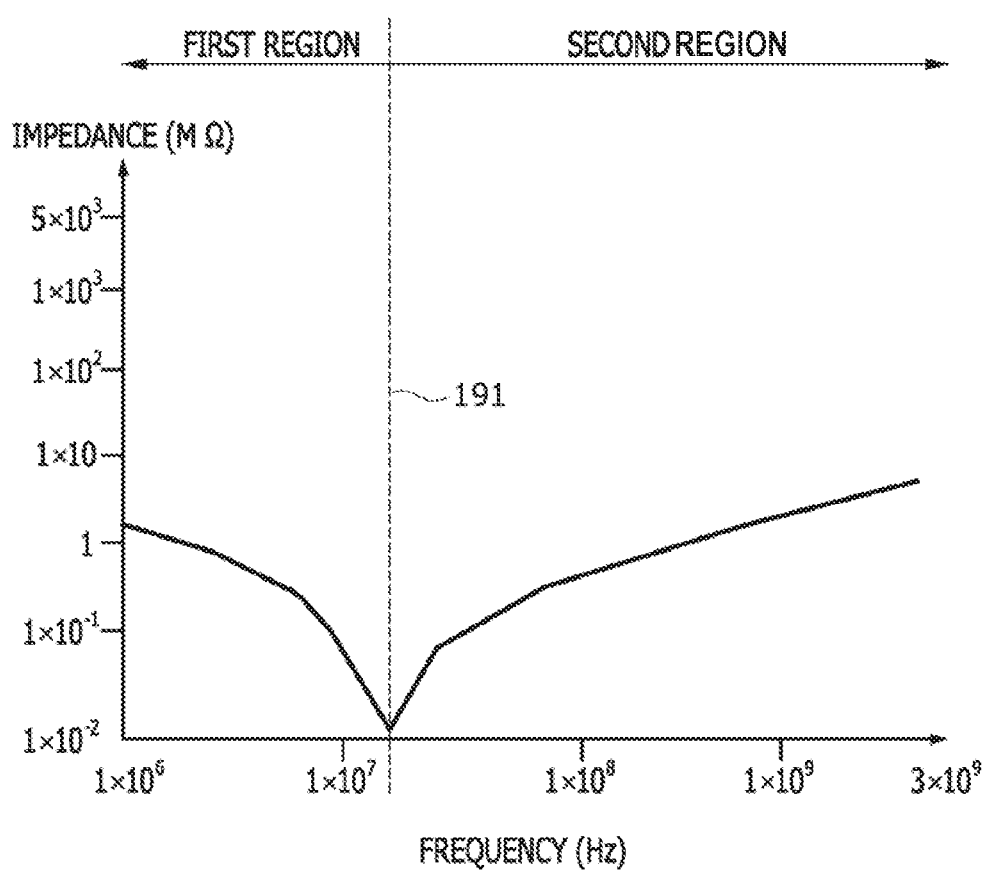
FIG. 4 shows a graph illustrating an impedance versus frequency characteristic of the equivalent circuit diagram shown in FIG. 3.

FIG. 4 shows a graph illustrating an impedance versus frequency characteristic of the equivalent circuit diagram shown in FIG. 3. In the graph of FIG. 4, the abscissa denotes a frequency, and the ordinate denotes an impedance value. Referring to FIG. 4, a frequency region may be divided into a first region (corresponding to a low frequency region) and a second region (corresponding to a high frequency region) by a frequency denoted by a reference numeral "191." An impedance characteristic in the first region may different from an impedance characteristic in the second region. In the first region (i.e., the low frequency region to the left of 191), the impedance value of the equivalent circuit diagram shown in FIG. 3 may be reduced if the frequency increases. On the contrary, in the second region (i.e., the high frequency region to the right of 191), the impedance value of the equivalent circuit diagram shown in FIG. 3 may increase if the frequency increases. The capacitive components 711, 712, and 713 may dominantly influence the impedance of the equivalent circuit diagram shown in FIG. 3 in the first region, and the inductive component 702 may dominantly influence the impedance of the equivalent circuit diagram (i.e., the R-L-C serial circuit) shown in FIG. 3 in the second region. A resonant frequency $f_R$ of the R-L-C serial circuit illustrated in FIG. 3 may be defined as a formula "$1/(2\pi\sqrt{LC})$" which is obtained when a reactance component of the R-L-C serial circuit is zero. The R-L-C serial circuit may have a minimum impedance value corresponding to only the resistance value "R" of the resistive component 701 at the resonant frequency $f_R$. In the case of the package substrate 100, according to the present embodiment, because the total equivalent capacitance value "C11+C12+C13" of the capacitive components increases due to the presence of the EM bandgap structure 190, the resonant frequency $f_R$ of the R-L-C serial circuit shown in FIG. 3 may be lowered to reduce an impedance level of the power network.

Figure 5:
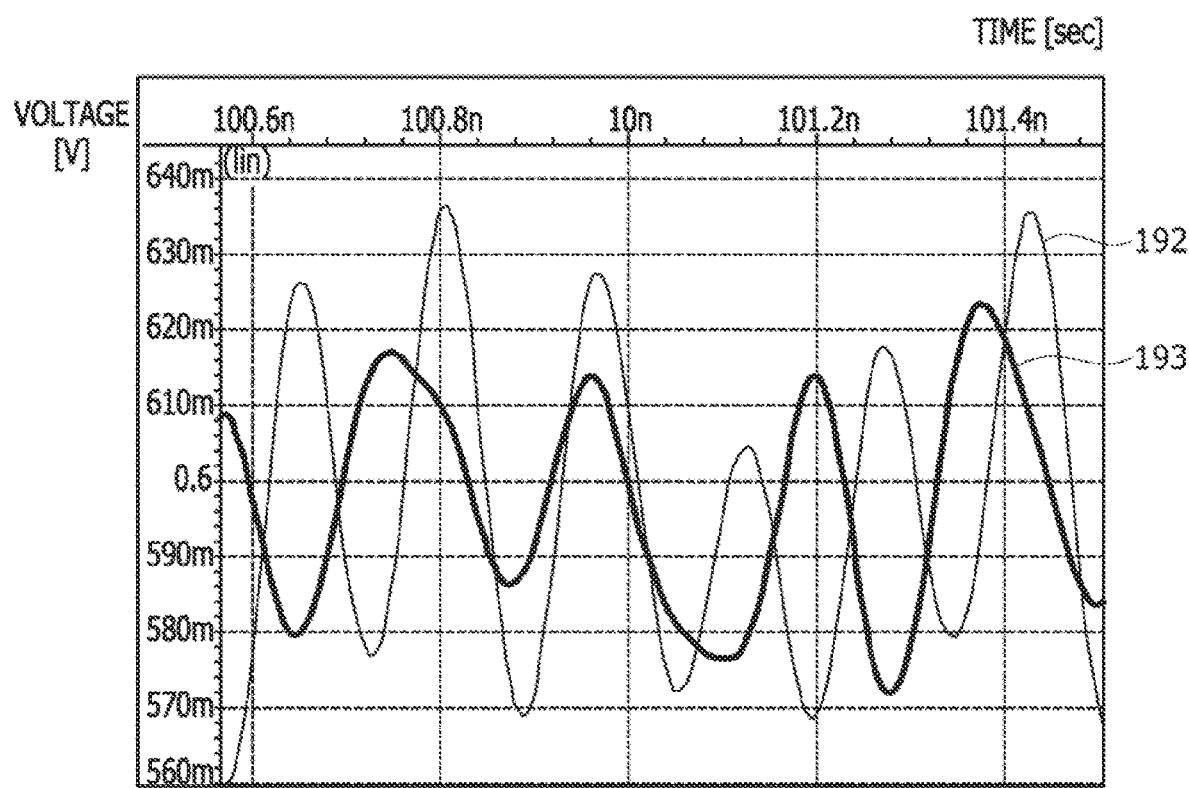
FIG. 5 shows a graph illustrating a peak voltage versus time characteristic of the package substrate shown in FIG. 1 together with a peak voltage versus time characteristic of a general package substrate.

FIG. 5 shows a graph illustrating a peak voltage versus time for the package substrate 100 shown in FIG. 1 in comparison to a peak voltage versus time for a general package substrate without the EM bandgap structure 190. In the graph of FIG. 5, the abscissa denotes time, and the ordinate denotes a voltage induced at the power plane 120. A data curve indicated by a reference numeral "192" represents a voltage versus time characteristic of the general package substrate without the EM bandgap structure 190, and a data curve indicated by a reference numeral "193" represents a voltage versus time characteristic of the package substrate 100 including the EM bandgap structure 190. As illustrated in FIG. 5, a voltage variation of the package substrate 100, in accordance with the present teachings, is less than a voltage variation of the general package substrate. Accordingly, the simultaneous switching noise (SSN) of the package substrate 100 may be relatively reduced as compared with the simultaneous switching noise (SSN) of the general package substrate.

Figure 6:
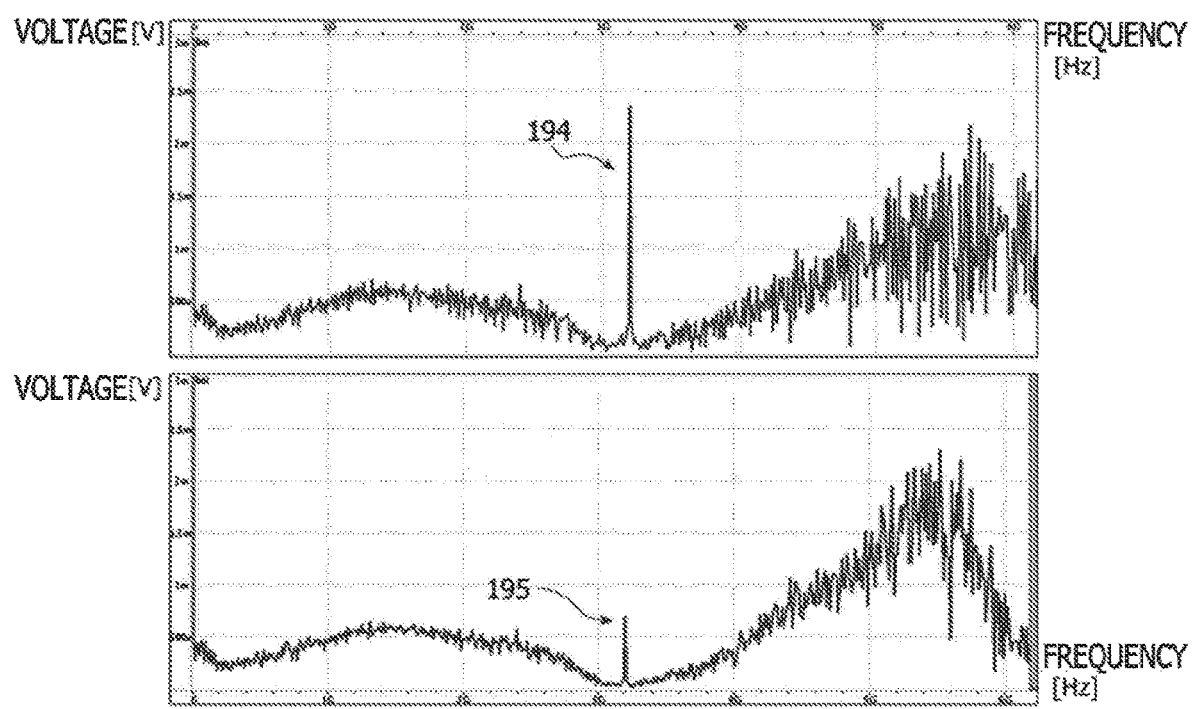
FIG. 6 shows a combined graph illustrating a peak voltage versus frequency characteristic of the package substrate shown in FIG. 1 together with a peak voltage versus frequency characteristic of a general package substrate.

FIG. 6 shows a combined graph illustrating a peak voltage versus frequency for the package substrate 100 shown in FIG. 1 in comparison to a peak voltage versus frequency for a general package substrate without the EM bandgap structure 190. In the combined graph of FIG. 6, the abscissas denote a frequency, and the ordinates denote a voltage induced at the power plane 120. An upper graph in FIG. 6 illustrates a voltage versus frequency characteristic of the general package substrate without the EM bandgap structure 190, and a lower graph in FIG. 6 illustrates a voltage versus frequency characteristic of the package substrate 100 including the EM bandgap structure 190. That is, a data curve indicated by a reference numeral "194" represents a voltage versus frequency characteristic of the general package substrate without the EM bandgap structure 190, and a data curve indicated by a reference numeral "195" represents a voltage versus frequency characteristic of the package substrate 100 including the EM bandgap structure 190. As illustrated in FIG. 6, a voltage variation in the high frequency region of the package substrate 100 is less than a voltage variation in the high frequency region of the general package substrate without the EM bandgap structure 190. Accordingly, the simultaneous switching noise (SSN) of the package substrate 100, in accordance with the present teachings, may be relatively reduced as compared with the simultaneous switching noise (SSN) of the general package substrate.

Figure 7:
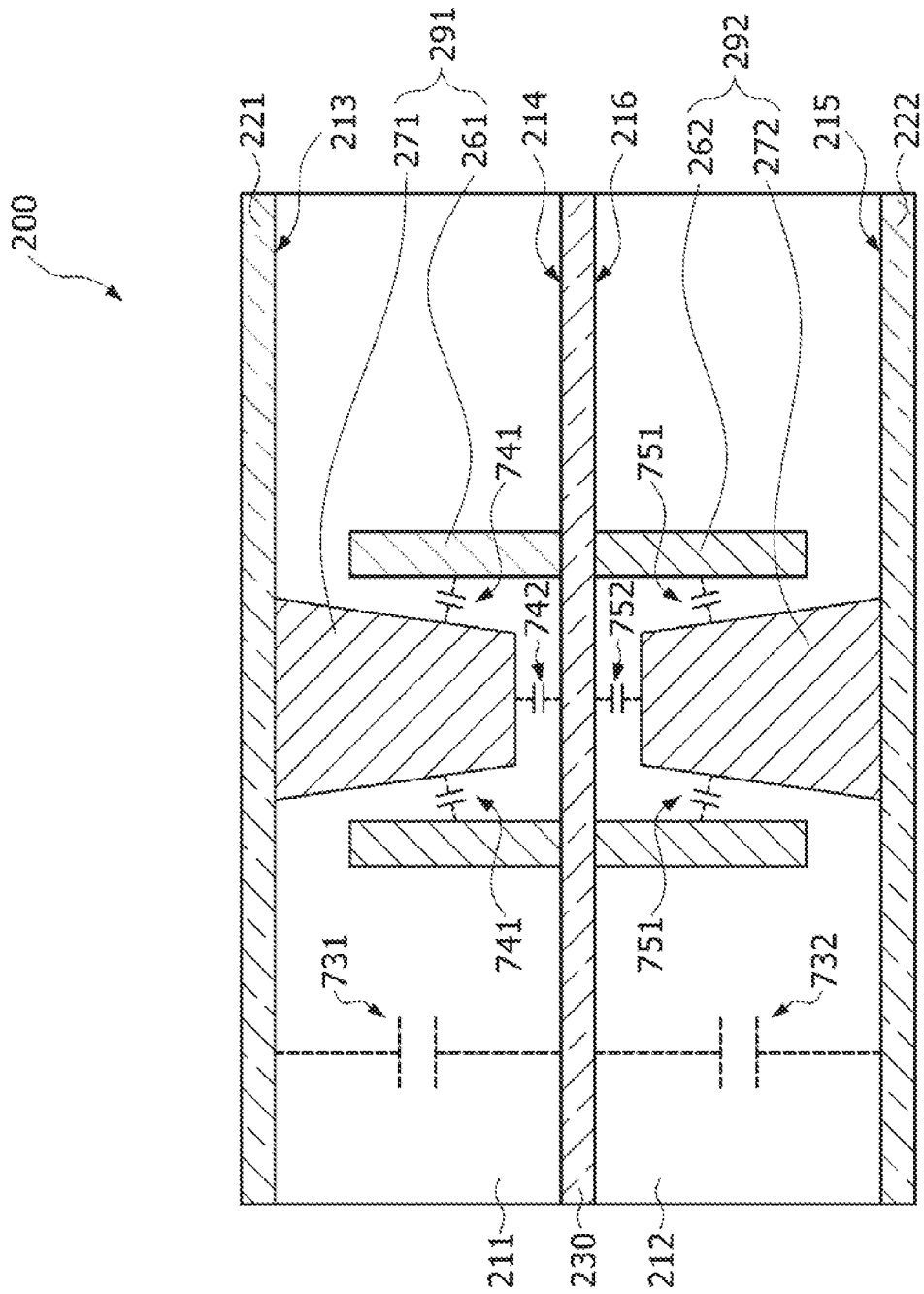
FIG. 7 shows a cross-sectional view illustrating a package substrate, according to another embodiment of the present disclosure.
Figure 8:
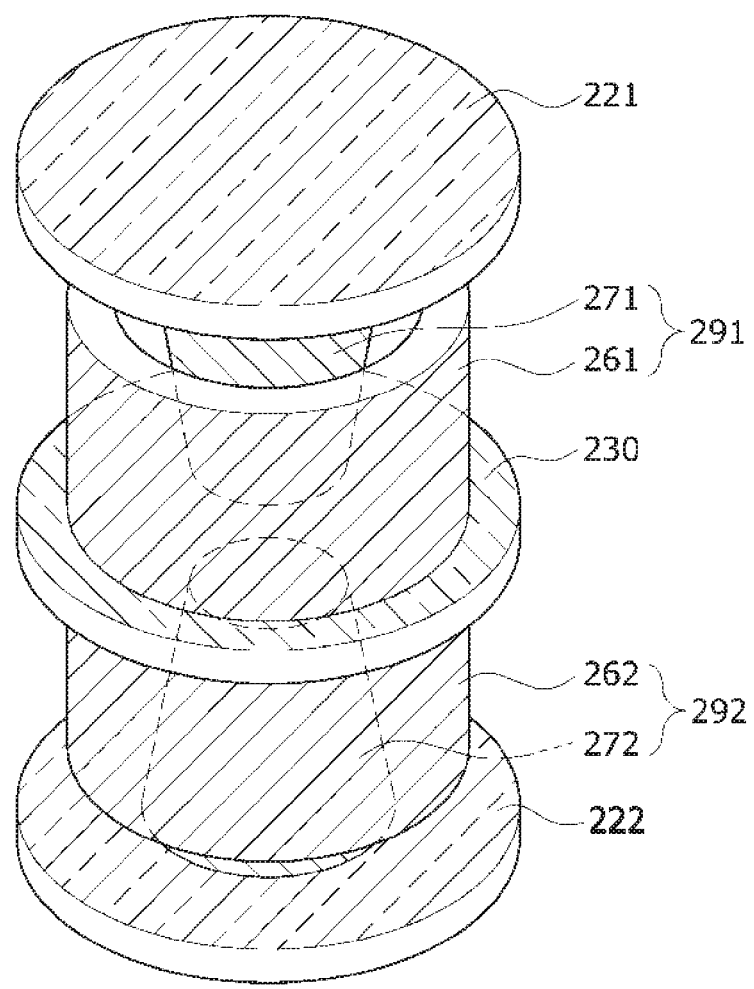
FIG. 8 shows a perspective view illustrating an EM bandgap structure of the package substrate shown in FIG. 7.

FIG. 7 shows a cross-sectional view illustrating a package substrate 200, according to another embodiment of the present disclosure. FIG. 8 shows a perspective view illustrating a first EM bandgap structure 291 and a second EM bandgap structure 292 of the package substrate 200 shown in FIG. 7. Referring to FIGS. 7 and 8, the package substrate 200 may have an interconnection structure including at least three layers. The package substrate 200 may include a first core layer 211, a second core layer 212, a first power plane interconnection layer 221, a second power plane interconnection layer 222, a ground plane interconnection layer 230, a first EM bandgap structure 291 and a second EM bandgap structure 292. The first and second core layers 211 and 212 may be insulation layers. The first core layer 211 may have a first surface 213 and a second surface 214, which are opposite to each other. The second core layer 212 may have a first surface 215 and a second surface 216, which are opposite to each other. The first core layer 211 may be vertically stacked on the second core layer 212 such that the second surface 214 of the first core layer 211 faces the second surface 216 of the second core layer 212. The first power plane interconnection layer 221 may be disposed on the first surface 213 of the first core layer 211. The second power plane interconnection layer 222 may be disposed on the first surface 215 of the second core layer 212. The ground plane interconnection layer 230 may be disposed between the second surface 214 of the first core layer 211 and the second surface 216 of the second core layer 212. Thus, the first core layer 211 may be disposed between the first power plane interconnection layer 221 and the ground plane interconnection layer 230, and the second core layer 212 may be disposed between the second power plane interconnection layer 222 and the ground plane interconnection layer 230. Although not shown in FIG. 7, one solder resist layer may be disposed on a surface of the first power plane interconnection layer 221 opposite to the first core layer 211, and another solder resist layer may be disposed on a surface of the second power plane interconnection layer 222 opposite to the second core layer 212.

In an embodiment, the first power plane interconnection layer 221, the second power plane interconnection layer 222, and the ground plane interconnection layer 230 may be conductive layers, such as metal layers. The first and second power plane interconnection layers 221 and 222 may transmit a power voltage, and the ground plane interconnection layer 230 may transmit a ground voltage. Although not shown in the drawings, the first power plane interconnection layer 221 may be electrically connected to the second power plane interconnection layer 222 through conductive vias disposed in the first and second core layers 211 and 212. Alternatively, the first and second power plane interconnection layers 221 and 222 may be configured to transmit two different power voltages. The first and second power plane interconnection layers 221 and 222 and the ground plane interconnection layer 230 may be disposed in parallel along the first and second surfaces 213, 214, 215 and 216 of the first and second core layers 211 and 212 to vertically overlap with each other. Thus, the first power plane interconnection layer 221, the first core layer 211, and the ground plane interconnection layer 230 may constitute a first parasitic capacitive component 731. In addition, the second power plane interconnection layer 222, the second core layer 212, and the ground plane interconnection layer 230 may constitute a second parasitic capacitive component 732.

The first EM bandgap structure 291 may be disposed in the first core layer 211 located between the first power plane interconnection layer 221 and the ground plane interconnection layer 230. The first EM bandgap structure 291 may be configured to include a first EM bandgap cylindrical structure 261 and a first EM bandgap via 271. Each of the first EM bandgap cylindrical structure 261 and the first EM bandgap via 271 may include a conductive material such as a metal material. The first EM bandgap cylindrical structure 261 may be disposed to extend from a top surface of the ground plane interconnection layer 230 toward a bottom surface of the first power plane interconnection layer 221. The top surface of the ground plane interconnection layer 230 may be in contact with the second surface 214 of the first core layer 211. The bottom surface of the first power plane interconnection layer 221 may be in contact with the first surface 213 of the first core layer 211. The first EM bandgap cylindrical structure 261 may provide a first opening hole defined by an inner side surface of the first EM bandgap cylindrical structure 261. A bottom surface of the first EM bandgap cylindrical structure 261 may directly contact the ground plane interconnection layer 230, and a top surface and side surfaces of the first EM bandgap cylindrical structure 261 may be covered with the first core layer 211. The first EM bandgap via 271 may be disposed to extend from the bottom surface of the first power plane interconnection layer 221 toward the top surface of the ground plane interconnection layer 230. While the first EM bandgap cylindrical structure 261 has a cylindrical shape, the first EM bandgap via 271 may have a blind via shape or structure. In an embodiment, the blind via shape means the first EM bandgap via 271 may correspond to a pillar having a round shape in a plan view and a reverse trapezoidal shape in a vertical cross-sectional view. A top surface of the first EM bandgap via 271 may directly contact the first power plane interconnection layer 221, and a bottom surface and a side surface of the first EM bandgap via 271 may be covered with the first core layer 211.

The first EM bandgap via 271 may be disposed such that a portion of the first EM bandgap via 271 is inserted into the first opening hole defined by the first EM bandgap cylindrical structure 261. That is, the inner side surface of the first EM bandgap cylindrical structure 261 may surround the side surface of the first EM bandgap via 271, and the first core layer 211 may be disposed between the first EM bandgap cylindrical structure 261 and the first EM bandgap via 271. Thus, the first EM bandgap via 271, the first core layer 211, and the first EM bandgap cylindrical structure 261 laterally overlap each other and may constitute a first EM bandgap capacitive component 741. In addition, the first EM bandgap via 271, the first core layer 211, and the ground plane interconnection layer 230 vertically overlap each other and may constitute a second EM bandgap capacitive component 742. The first EM bandgap capacitive component 741, the second EM bandgap capacitive component 742, and the first parasitic capacitive component 731 may be coupled in parallel to constitute a total capacitive component between the first power plane interconnection layer 221 and the ground plane interconnection layer 230. Accordingly, the total capacitance value between the first power plane interconnection layer 221 and the ground plane interconnection layer 230 may increase due to presence of the first EM bandgap capacitive component 741 and the second EM bandgap capacitive component 742.

The second EM bandgap structure 292 may be disposed in the second core layer 212 located between the second power plane interconnection layer 222 and the ground plane interconnection layer 230. The second EM bandgap structure 292 may be configured to include a second EM bandgap cylindrical structure 262 and a second EM bandgap via 272. Each of the second EM bandgap cylindrical structure 262 and the second EM bandgap via 272 may include a conductive material, such as a metal material. The second EM bandgap cylindrical structure 262 may be disposed to extend from a bottom surface of the ground plane interconnection layer 230 toward a top surface of the second power plane interconnection layer 222. The bottom surface of the ground plane interconnection layer 230 may be in contact with the second surface 216 of the second core layer 212. The top surface of the second power plane interconnection layer 222 may be in contact with the first surface 215 of the second core layer 212. The second EM bandgap cylindrical structure 262 may provide a second opening hole defined by an inner side surface of the second EM bandgap cylindrical structure 262. A top surface of the second EM bandgap cylindrical structure 262 may directly contact the ground plane interconnection layer 230, and a bottom surface and side surfaces of the second EM bandgap cylindrical structure 262 may be covered with the second core layer 212. The second EM bandgap via 272 may be disposed to extend from the top surface of the second power plane interconnection layer 222 toward the bottom surface of the ground plane interconnection layer 230. While the second EM bandgap cylindrical structure 262 has a cylindrical shape, the second EM bandgap via 272 may have a blind via shape. In an embodiment, the second EM bandgap via 272 may correspond to a pillar having a round shape in a plan view and a trapezoidal shape in a vertical cross-sectional view. A bottom surface of the second EM bandgap via 272 may directly contact the second power plane interconnection layer 222, and a top surface and a side surface of the second EM bandgap via 272 may be covered with the second core layer 212.

The second EM bandgap via 272 may be disposed such that a portion of the second EM bandgap via 272 is inserted into the second opening hole defined by the second EM bandgap cylindrical structure 262. That is, the inner side surface of the second EM bandgap cylindrical structure 262 may surround the side surface of the second EM bandgap via 272, and the second core layer 212 may be disposed between the second EM bandgap cylindrical structure 262 and the second EM bandgap via 272. Thus, the second EM bandgap via 272, the second core layer 212, and the second EM bandgap cylindrical structure 262 laterally overlap each other and may constitute a third EM bandgap capacitive component 751. In addition, the second EM bandgap via 272, the second core layer 212, and the ground plane interconnection layer 230 vertically overlap each other and may constitute a fourth EM bandgap capacitive component 752. The third EM bandgap capacitive component 751, the fourth EM bandgap capacitive component 752, and the second parasitic capacitive component 732 may be coupled in parallel to constitute a total capacitive component between the second power plane interconnection layer 222 and the ground plane interconnection layer 230. Accordingly, the total capacitance value between the second power plane interconnection layer 222 and the ground plane interconnection layer 230 may increase due to presence of the third EM bandgap capacitive component 751 and the fourth EM bandgap capacitive component 752.

For an embodiment, the first EM bandgap structure 291 and the second EM bandgap structure 292 may have a symmetric structure to the ground plane interconnection layer 230. Thus, the first EM bandgap cylindrical structure 261 and the second EM bandgap cylindrical structure 262 may be symmetric to each other with respect to the ground plane interconnection layer 230, and the first EM bandgap via 271 and the second EM bandgap via 272 may also be symmetric to each other with respect to the ground plane interconnection layer 230. However, FIG. 7 merely illustrates one example of suitable embodiments. Accordingly, a position of the first EM bandgap structure 291 and a position of the second EM bandgap structure 292 may be different according to a design scheme, an interconnection structure, and/or a purpose of the package substrate 200.

Figure 9:
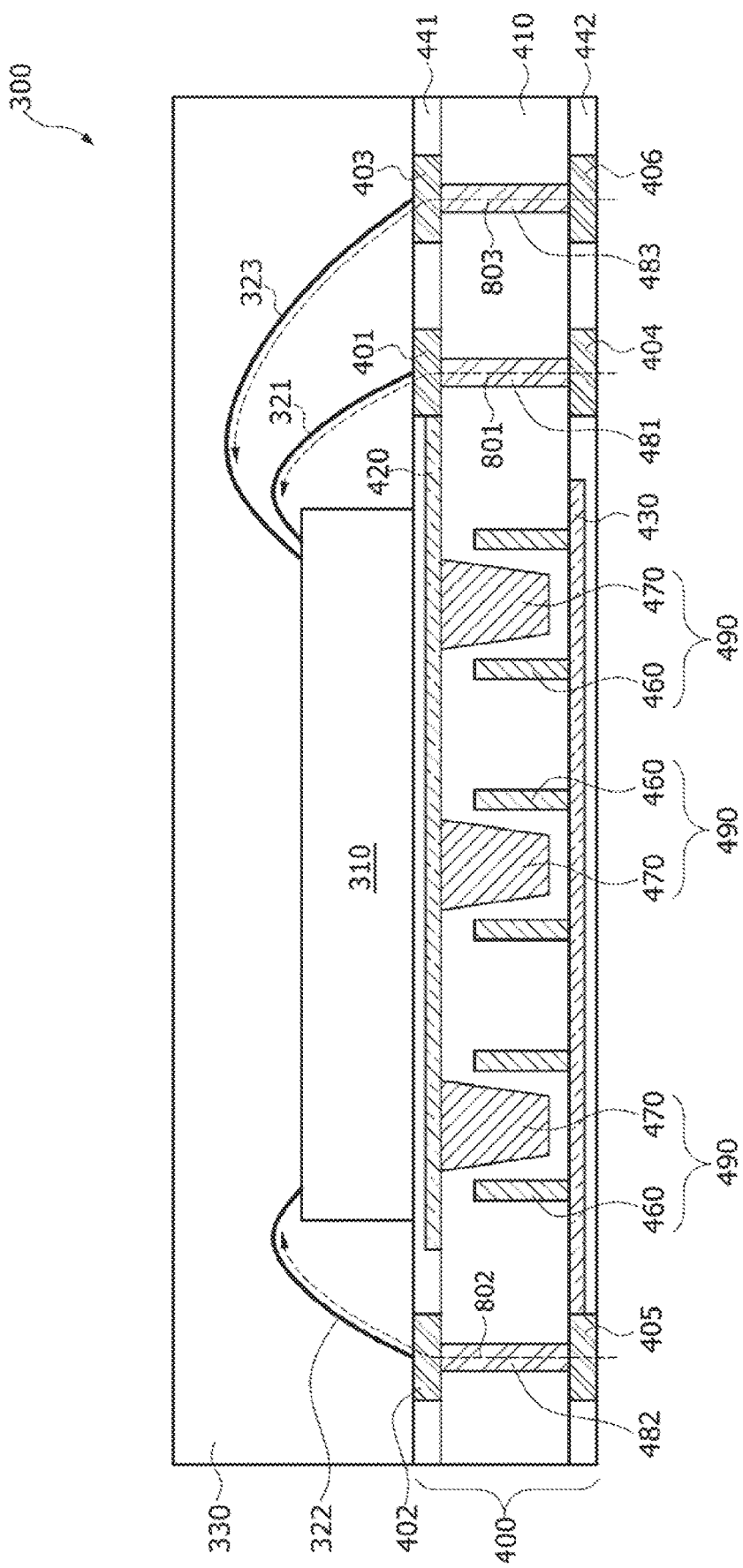
FIG. 9 shows a cross-sectional view illustrating a semiconductor package, according to an embodiment of the present disclosure.

FIG. 9 shows a cross-sectional view illustrating a semiconductor package 300, according to an embodiment of the present disclosure. Referring to FIG. 9, the semiconductor package 300 may be configured to include a package substrate 400, a chip 310 mounted on the package substrate 400, and a molding member 330 disposed on the package substrate 400 to cover the chip 310. The package substrate 400 may include a core layer 410, a power plane interconnection layer 420, a ground plane interconnection layer 430, and at least one EM bandgap structure 490. The power plane interconnection layer 420 may be disposed on a top surface of the core layer 410, and the ground plane interconnection layer 430 may be disposed on a bottom surface of the core layer 410 opposite to the power plane interconnection layer 420. A first solder resist layer 441 may be disposed on the top surface of the core layer 410 to cover the power plane interconnection layer 420. A second solder resist layer 442 may be disposed on the bottom surface of the core layer 410 to cover the ground plane interconnection layer 430.

The first solder resist layer 441 may have a plurality of openings therein, and bonding pads may be disposed in respective openings of the first solder resist layer 441. A first bonding pad 401 of the bonding pads may be disposed to contact the power plane interconnection layer 420 and may be electrically connected to the chip 310 through a first wire 321. A second bonding pad 402 of the bonding pads may be electrically connected to the chip 310 through a second wire 322. Moreover, a third bonding pad 403 of the bonding pads may be electrically connected to the chip 310 through a third wire 323. The second solder resist layer 442 may also have a plurality of openings therein. Outer connection pads may be disposed in openings of the second solder resist layer 442. A first outer connection pad 404 of the outer connection pads may be electrically connected to the first bonding pad 401 through a first via 481. A second outer connection pad 405 of the outer connection pads may be electrically connected to the second bonding pad 402 through a second via 482. The second outer connection pad 405 may be disposed to contact the ground plane interconnection layer 430. A third outer connection pad 406 of the outer connection pads may be electrically connected to the third bonding pad 403 through a third via 483. The first, second, and third vias 481, 482, and 483 may be disposed to vertically penetrate the core layer 410. A power path (indicated by an arrow "801" in FIG. 9) for supplying a power voltage to the chip 310 may be provided by the first outer connection pad 404, the first via 481, the first bonding pad 401, and the first wire 321, A ground path (indicated by an arrow "802" in FIG. 9) for supplying a ground voltage to the chip 310 may be provided by the second outer connection pad 405, the second via 482, the second bonding pad 402, and the second wire 322. A signal path (indicated by an arrow "803" in FIG. 9) for transmitting data signals to the chip 310 or outputting the data signals from the chip 310 may be provided by the third outer connection pad 406, the third via 483, the third bonding pad 403, and the third wire 323.

The core layer 410 may be an insulation layer. The power plane interconnection layer 420 and the ground plane interconnection layer 430 may be disposed on the top surface and the bottom surface of the core layer 410, respectively. In an embodiment, the top surface of the core layer 410 may correspond to a surface on which the chip 310 is disposed, and the bottom surface of the core layer 410 may be located on an opposite side of the chip 310. The power plane interconnection layer 420 and the ground plane interconnection layer 430 may be conductive layers, such as metal layers. The power plane interconnection layer 420 may transmit a power voltage to the chip 310, and the ground plane interconnection layer 430 may transmit a ground voltage to the chip 310. In an embodiment, the power plane interconnection layer 420 and the ground plane interconnection layer 430 may be disposed in parallel along the top and bottom surfaces of the core layer 410 to vertically overlap with each other. Thus, the power plane interconnection layer 420, the core layer 410, and the ground plane interconnection layer 430 vertically overlap each other and may constitute a parasitic capacitive component.

The at least one EM bandgap structure 490 may be disposed in the core layer 410 located between the power plane interconnection layer 420 and the ground plane interconnection layer 430. In an embodiment, the at least one EM bandgap structure 490 may include three EM bandgap structures 490 coupled in parallel between the power plane interconnection layer 420 and the ground plane interconnection layer 430. However, the number of the EM bandgap structures 490 and a connection relationship between the EM bandgap structures 490 may be different for different embodiments. Each of the EM bandgap structures 490 may include an EM bandgap cylindrical structure 460 and an EM bandgap via 470. Each of the EM bandgap cylindrical structure 460 and the EM bandgap via 470 may include a conductive material, such as a metal material. The EM bandgap cylindrical structure 460 may be disposed to extend from a top surface of the ground plane interconnection layer 430 toward a bottom surface of the power plane interconnection layer 420. The bottom surface of the power plane interconnection layer 420 may be a surface that is in contact with the core layer 410. The EM bandgap cylindrical structure 460 may provide an opening hole defined by an inner side surface of the EM bandgap cylindrical structure 460. A bottom surface of the EM bandgap cylindrical structure 460 may directly contact the ground plane interconnection layer 430, and a top surface and side surfaces of the EM bandgap cylindrical structure 460 may be covered with the core layer 410. The EM bandgap via 470 may be disposed to extend from the bottom surface of the power plane interconnection layer 420 toward the top surface of the ground plane interconnection layer 430. While the EM bandgap cylindrical structure 460 has a cylindrical shape, the EM bandgap via 470 may have a blind via shape. In an embodiment, the EM bandgap via 470 may correspond to a pillar having a round shape in a plan view and a reverse trapezoidal shape in a vertical cross-sectional view. A top surface of the EM bandgap via 470 may directly contact the power plane interconnection layer 420, and a bottom surface and a side surface of the EM bandgap via 470 may be covered with the core layer 410.

The EM bandgap via 470 may be disposed such that a portion of the EM bandgap via 470 is inserted into the opening hole defined by the EM bandgap cylindrical structure 460. That is, the inner side surface of the EM bandgap cylindrical structure 460 may surround the side surface of the EM bandgap via 470, and the core layer 410 may be disposed between the EM bandgap cylindrical structure 460 and the EM bandgap via 470. Thus, in each of the EM bandgap structures 490, the EM bandgap via 470, the core layer 410, and the EM bandgap cylindrical structure 460 laterally overlap each other and may constitute a first EM bandgap capacitive component, and the EM bandgap via 470, the core layer 410, and the ground plane interconnection layer 430 vertically overlap each other and may constitute a second EM bandgap capacitive component. The first EM bandgap capacitive components of the EM bandgap structures 490, the second EM bandgap capacitive components of the EM bandgap structures 490, and the first parasitic capacitive component may be coupled in parallel to constitute a total capacitive component between the power plane interconnection layer 420 and the ground plane interconnection layer 430. Accordingly, the total capacitance value between the power plane interconnection layer 420 and the ground plane interconnection layer 430 may increase due to presence of the first and second EM bandgap capacitive components of the EM bandgap structures 490.

Figure 10:
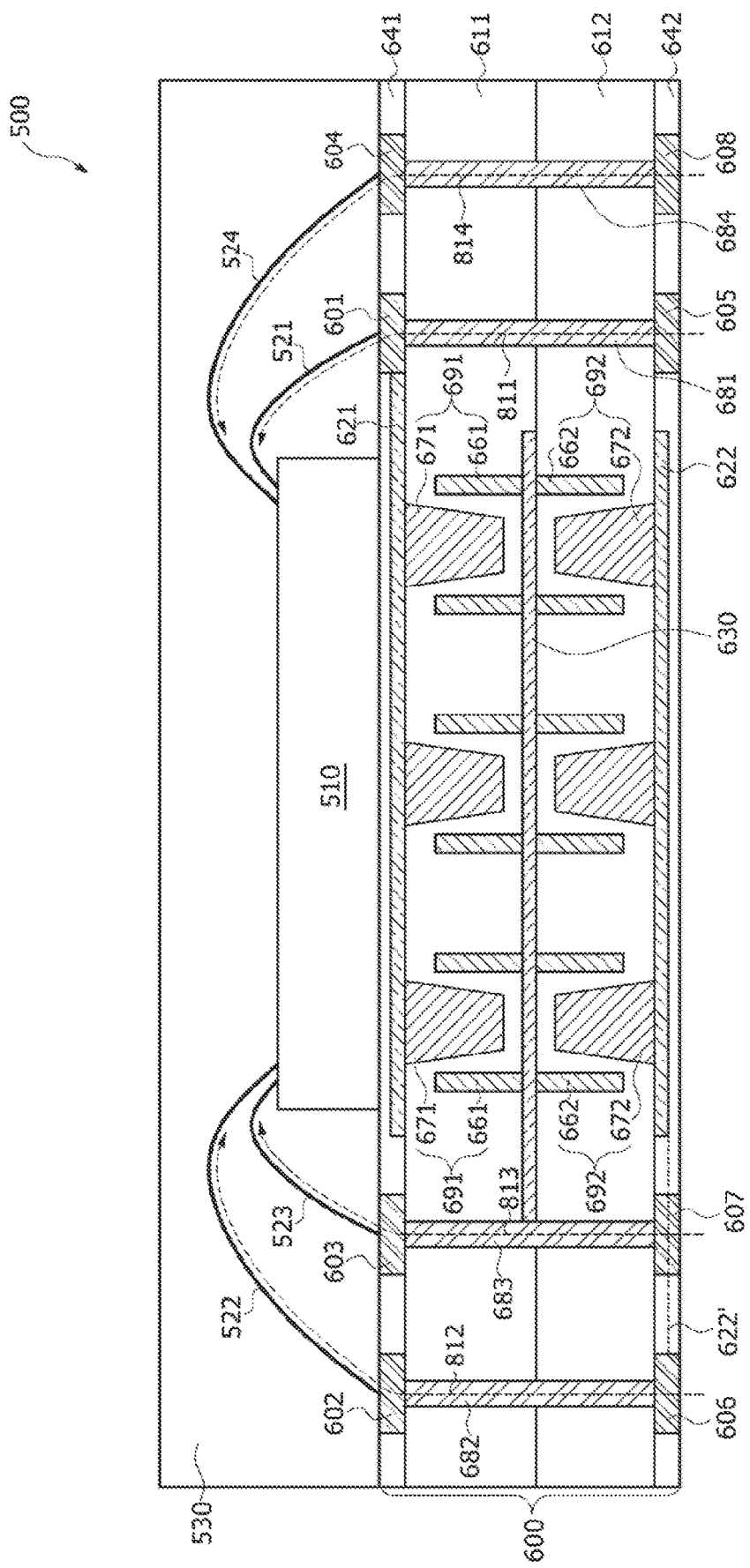
FIG. 10 shows a cross-sectional view illustrating a semiconductor package, according to another embodiment of the present disclosure.

FIG. 10 shows a cross-sectional view illustrating a semiconductor package 500, according to another embodiment of the present disclosure. Referring to FIG. 10, the semiconductor package 500 may be configured to include a package substrate 600, a chip 510 mounted on the package substrate 600, and a molding member 530 disposed on the package substrate 600 to cover the chip 510. The package substrate 600 may include a first core layer 611, a second core layer 612, a first power plane interconnection layer 621, a second power plane interconnection layer 622, a ground plane interconnection layer 630, at least one first EM bandgap structure 691, and at least one second EM bandgap structure 692. The first core layer 611 may be attached to a top surface of the second core layer 612. The first power plane interconnection layer 621 may be disposed on a top surface of the first core layer 611 opposite to the second core layer 612, and the second power plane interconnection layer 622 may be disposed on a bottom surface of the second core layer 612 opposite to the first core layer 611. The ground plane interconnection layer 630 may be disposed between the first core layer 611 and the second core layer 612. A first solder resist layer 641 may be disposed on the top surface of the first core layer 611 to cover the first power plane interconnection layer 621. A second solder resist layer 642 may be disposed on the bottom surface of the second core layer 612 to cover the second power plane interconnection layer 622. In such case, the chip 510 may be mounted on a top surface of the first solder resist layer 641.

The first solder resist layer 641 may have a plurality of openings therein, and bonding pads may be disposed in respective openings of the first solder resist layer 641. A first bonding pad 601 of the bonding pads may be disposed to contact the first power plane interconnection layer 621 and may be electrically connected to the chip 510 through a first wire 521. A second bonding pad 602 of the bonding pads may be electrically connected to the chip 510 through a second wire 522. Moreover, a third bonding pad 603 of the bonding pads may be electrically connected to the chip 510 through a third wire 523, and a fourth bonding pad 604 of the bonding pads may be electrically connected to the chip 510 through a fourth wire 524.

The second solder resist layer 642 may also have a plurality of openings therein. Outer connection pads may be disposed in respective openings of the second solder resist layer 642. A first outer connection pad 605 of the outer connection pads may be electrically connected to the first bonding pad 601 through a first via 681. A second outer connection pad 606 of the outer connection pads may be electrically connected to the second power plane interconnection layer 622 through an extension line 622' of the second power plane interconnection layer 622 and may also be electrically connected to the second bonding pad 602 through a second via 682. In FIG. 10, the extension line 622' of the second power plane interconnection layer 622 is shown by dot line. A third outer connection pad 607 of the outer connection pads may be electrically connected to the third bonding pad 603 through a third via 683, and the third via 683 may be disposed to contact the ground plane interconnection layer 630. A fourth outer connection pad 608 of the outer connection pads may be electrically connected to the fourth bonding pad 604 through a fourth via 684. Each of the first to fourth vias 681, 682, 683, and 684 may be disposed to vertically penetrate the first and second core layers 611 and 612.

A first power path (indicated by an arrow "811" in FIG. 10) for supplying a first power voltage to the chip 510 may be provided by the first outer connection pad 605, the first via 681, the first bonding pad 601, and the first wire 521. A second power path (indicated by an arrow "812" in FIG. 10) for supplying a second power voltage to the chip 510 may be provided by the second outer connection pad 606, the first via 682, the second bonding pad 602, and the second wire 522. The first power voltage and the second power voltage may be the same voltage or different voltages. Even though the first power voltage and the second power voltage may be the same voltage, the first power voltage and the second power voltage may be supplied to the chip 510 through two separate power paths (i.e., the first power path 811 and the second power path 812). A ground path (indicated by an arrow "813" in FIG. 10) for supplying a ground voltage to the chip 510 may be provided by the third outer connection pad 607, the third via 683, the third bonding pad 603, and the third wire 523. A signal path (indicated by an arrow "814" in FIG. 10) for transmitting data signals to the chip 510 or outputting the data signals from the chip 510 may be provided by the fourth outer connection pad 608, the fourth via 684, the fourth bonding pad 604, and the fourth wire 524.

Although FIG. 10 illustrates an example in which each of the first to fourth vias 681, 682, 683, and 684 is a through via penetrating the first and second core layers 611 and 612, the present disclosure is not limited thereto. For example, in other embodiments, the signal path 814 may be configured to include a first sub-via penetrating only the first core layer 611 and a second sub-via penetrating only the second core layer 612, in order to electrically connect the fourth outer connection pad 608 to the fourth bonding pad 604.

The first core layer 611 and the second core layer 612 may be insulation layers. The first power plane interconnection layer 621, the second power plane interconnection layer 622, and the ground plane interconnection layer 630 may be conductive layers, such as metal layers. In an embodiment, the first and second power plane interconnection layers 621 and 622 and the ground plane interconnection layer 630 may be disposed in parallel along the surfaces of the first and second core layers 611 and 612 to vertically overlap with each other. Thus, the first power plane interconnection layer 621, the first core layer 611, and the ground plane interconnection layer 630 vertically overlap each other and may constitute a first parasitic capacitive component. In addition, the second power plane interconnection layer 622, the second core layer 612, and the ground plane interconnection layer 630 vertically overlap each other and may constitute a second parasitic capacitive component.

The at least one first EM bandgap structure 691 may be disposed in the first core layer 611 located between the first power plane interconnection layer 621 and the ground plane interconnection layer 630. In an embodiment, the at least one first EM bandgap structure 691 may include three first EM bandgap structures 691 coupled in parallel between the first power plane interconnection layer 621 and the ground plane interconnection layer 630. Each of the first EM bandgap structures 691 may include a first EM bandgap cylindrical structure 661 and a first EM bandgap via 671.

Each of the first EM bandgap cylindrical structure 661 and the first EM bandgap via 671 may include a conductive material, such as a metal material. The first EM bandgap cylindrical structure 661 may be disposed to extend from a top surface of the ground plane interconnection layer 630 toward a bottom surface of the first power plane interconnection layer 621. The bottom surface of the first power plane interconnection layer 621 may be a surface that is in contact with the first core layer 611. The first EM bandgap cylindrical structure 661 may provide a first opening hole defined by an inner side surface of the first EM bandgap cylindrical structure 661. A bottom surface of the first EM bandgap cylindrical structure 661 may directly contact the ground plane interconnection layer 630, and a top surface and side surfaces of the first EM bandgap cylindrical structure 661 may be covered with the first core layer 611. The first EM bandgap via 671 may be disposed to extend from the bottom surface of the first power plane interconnection layer 621 toward the top surface of the ground plane interconnection layer 630. While the first EM bandgap cylindrical structure 661 has a cylindrical shape, the first EM bandgap via 671 may have a blind via shape. In an embodiment, the first EM bandgap via 671 may correspond to a pillar having a round shape in a plan view and a reverse trapezoidal shape in a vertical cross-sectional view. A top surface of the first EM bandgap via 671 may directly contact the first power plane interconnection layer 621, and a bottom surface and a side surface of the first EM bandgap via 671 may be covered with the first core layer 611.

The first EM bandgap via 671 may be disposed such that a portion of the first EM bandgap via 671 is inserted into the first opening hole defined by the first EM bandgap cylindrical structure 661. That is, the inner side surface of the first EM bandgap cylindrical structure 661 may surround the side surface of the first EM bandgap via 671, and the first core layer 611 may be disposed between the first EM bandgap cylindrical structure 661 and the first EM bandgap via 671. Thus, in each of the first EM bandgap structures 691, the first EM bandgap via 671, the first core layer 611, and the first EM bandgap cylindrical structure 661 laterally overlap each other and may constitute a first EM bandgap capacitive component, and the first EM bandgap via 671, the first core layer 611, and the ground plane interconnection layer 630 vertically overlap each other and may constitute a second EM bandgap capacitive component. The first EM bandgap capacitive components of the first EM bandgap structures 691, the second EM bandgap capacitive components of the first EM bandgap structures 691, and the first parasitic capacitive component may be coupled in parallel to constitute a total capacitive component between the first power plane interconnection layer 621 and the ground plane interconnection layer 630. Accordingly, the total capacitance value between the first power plane interconnection layer 621 and the ground plane interconnection layer 630 may increase due to presence of the first and second EM bandgap capacitive components of the first EM bandgap structures 691.

The at least one second EM bandgap structure 692 may be disposed in the second core layer 612 located between the second power plane interconnection layer 622 and the ground plane interconnection layer 630. In an embodiment, the at least one second EM bandgap structure 692 may include three second EM bandgap structures 692 coupled in parallel between the second power plane interconnection layer 622 and the ground plane interconnection layer 630. Each of the second EM bandgap structures 692 may include a second EM bandgap cylindrical structure 662 and a second EM bandgap via 672. Each of the second EM bandgap cylindrical structure 662 and the second EM bandgap via 672 may include a conductive material, such as a metal material. The second EM bandgap cylindrical structure 662 may be disposed to extend from a bottom surface of the ground plane interconnection layer 630 toward a top surface of the second power plane interconnection layer 622. The top surface of the second power plane interconnection layer 622 may be a surface that is in contact with the second core layer 612. The second EM bandgap cylindrical structure 662 may provide a second opening hole defined by an inner side surface of the second EM bandgap cylindrical structure 662. A top surface of the second EM bandgap cylindrical structure 662 may directly contact the ground plane interconnection layer 630, and a bottom surface and side surfaces of the second EM bandgap cylindrical structure 662 may be covered with the second core layer 612. The second EM bandgap via 672 may be disposed to extend from the top surface of the second power plane interconnection layer 622 toward the bottom surface of the ground plane interconnection layer 630. While the second EM bandgap cylindrical structure 662 has a cylindrical shape, the second EM bandgap via 672 may have a blind via shape. In an embodiment, the second EM bandgap via 672 may correspond to a pillar having a round shape in a plan view and a trapezoidal shape in a vertical cross-sectional view. A bottom surface of the second EM bandgap via 672 may directly contact the second power plane interconnection layer 622, and a top surface and a side surface of the second EM bandgap via 672 may be covered with the second core layer 612.

The second EM bandgap via 672 may be disposed such that a portion of the second EM bandgap via 672 is inserted into the second opening hole defined by the second EM bandgap cylindrical structure 662. That is, the inner side surface of the second EM bandgap cylindrical structure 662 may surround the side surface of the second EM bandgap via 672, and the second core layer 612 may be disposed between the second EM bandgap cylindrical structure 662 and the second EM bandgap via 672. Thus, in each of the second EM bandgap structures 692, the second EM bandgap via 672, the second core layer 612, and the second EM bandgap cylindrical structure 662 laterally overlap each other and may constitute a third EM bandgap capacitive component, and the second EM bandgap via 672, the second core layer 612, and the ground plane interconnection layer 630 vertically overlap each other and may constitute a fourth EM bandgap capacitive component. The third EM bandgap capacitive components of the second EM bandgap structures 692, the fourth EM bandgap capacitive components of the second EM bandgap structures 692, and the second parasitic capacitive component may be coupled in parallel to constitute a total capacitive component between the second power plane interconnection layer 622 and the ground plane interconnection layer 630. Accordingly, the total capacitance value between the second power plane interconnection layer 622 and the ground plane interconnection layer 630 may increase due to presence of the third and fourth EM bandgap capacitive components of the second EM bandgap structures 692.

In an embodiment, the first EM bandgap structures 691 and the second EM bandgap structures 692 may have a symmetric structure to the ground plane interconnection layer 630. Thus, the first EM bandgap cylindrical structures 661 and the second EM bandgap cylindrical structures 662 may be symmetric to each other with respect to the ground plane interconnection layer 630, and the first EM bandgap vias 671 and the second EM bandgap vias 672 may also be symmetric to each other with respect to the ground plane interconnection layer 630. However, FIG. 10 illustrates one example among many suitable embodiments. Accordingly, a position of the first EM bandgap structures 691 and a position of the second EM bandgap structures 692 may be different according to a design scheme, an interconnection structure, and/or a purpose of the package substrate 600.

According to the above embodiments, an EM bandgap structure is disposed between a power plane interconnection layer and a ground plane interconnection layer included in a package substrate to reduce an impedance level of a power network including the power plane interconnection layer and the ground plane interconnection layer. Accordingly, noise of the package substrate may be reduced.

Embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A semiconductor package comprising:
   a package substrate including a core layer having a first surface and a second surface opposite to the first surface,
   a power plane interconnection layer disposed on the first surface of the core layer;
   a ground plane interconnection layer disposed on the second surface of the core layer;
   at least one electromagnetic (EM) bandgap structure disposed in the core layer and electrically coupled between the power plane interconnection layer and the ground plane interconnection layer;
   a chip mounted on the package substrate; and
   a molding member disposed on a surface of the package substrate to cover the chip,
   wherein each of the at least one EM bandgap structure includes:
   an EM bandgap via protruding from a portion of the power plane interconnection layer toward the ground plane interconnection layer; and
   an EM bandgap cylindrical structure extending from a portion of the ground plane interconnection layer toward the power plane interconnection layer and surrounding a side surface of the EM bandgap via.

2. The semiconductor package of claim 1, wherein the at least one EM bandgap structure comprises a plurality of EM bandgap structures spaced apart from each other and electrically coupled in parallel between the power plane interconnection layer and the ground plane interconnection layer.

3. The semiconductor package of claim 1,
   wherein the core layer is an insulation layer; and
   wherein the power plane interconnection layer, the ground plane interconnection layer, the EM bandgap via and the EM bandgap cylindrical structure are comprised of at least one conductive material.

4. The semiconductor package of claim 1, wherein the power plane interconnection layer is disposed along the first surface of the core layer, wherein the ground plane interconnection layer is disposed along the second surface of the core layer substantially parallel to the power plane interconnection layer, and wherein the power plane interconnection layer and the ground plane interconnection layer overlap one another.

5. The semiconductor package of claim 1, wherein an inner side surface of the EM bandgap cylindrical structure is separated from a side surface of the EM bandgap via by the core layer.

6. The semiconductor package of claim 1, wherein the EM bandgap via has a blind via structure.

7. The semiconductor package of claim 6, wherein the blind via structure is a pillar having a round shape in a plan view and a trapezoidal shape in a vertical cross-sectional view.

8. The semiconductor package of claim 1, wherein a bottom surface of the EM bandgap via is separated from the ground plane interconnection layer by the core layer.

9. The semiconductor package of claim 1, further comprising:
   a power path for supplying a power voltage to the chip;
   a ground path for supplying a ground voltage to the chip; and
   a signal path for at least one of transmitting data signals to the chip and outputting the data signals from the chip.

10. The semiconductor package of claim 9,
    wherein the power path comprises a first wire, a first bonding pad, a first via, and a first outer connection pad all electrically interconnected, wherein the first wire connects the chip to the first bonding pad, wherein the first via connects the first bonding pad to the first outer connection pad, and wherein the first bonding pad is disposed to contact the power plane interconnection layer;
    wherein the ground path comprises a second wire, a second bonding pad, a second via, and a second outer connection pad all electrically interconnected, wherein the second wire connects the chip to the second bonding pad, wherein the second via connects the second bonding pad to the second outer connection pad, and wherein the second outer connection pad is disposed to contact the ground plane interconnection layer; and
    wherein the signal path comprises a third wire, a third bonding pad, a third via, and a third outer connection pad all electrically interconnected, wherein the third wire connects the chip to the third bonding pad, and wherein the third via connects the third bonding pad to the third outer connection pad.

11. A package substrate comprising:
    a core layer comprising a first surface and a second surface which are opposite to each other;
    a power plane interconnection layer disposed on the first surface of the core layer;
    a ground plane interconnection layer disposed on the second surface of the core layer; and
    an electromagnetic (EM) bandgap structure disposed in the core layer and electrically coupled between the power plane interconnection layer and the ground plane interconnection layer, wherein the EM bandgap structure comprises:
    an EM bandgap via protruding from a portion of the power plane interconnection layer toward the ground plane interconnection layer; and
    an EM bandgap cylindrical structure extending from a portion of the ground plane interconnection layer toward the power plane interconnection layer and surrounding a side surface of the EM bandgap via.

12. The package substrate of claim 11,
    wherein the core layer is an insulation layer; and
    wherein the power plane interconnection layer, the ground plane interconnection layer, the EM bandgap via, and the EM bandgap cylindrical structure are comprised of at least one conductive material.

13. The package substrate of claim 11, wherein the power plane interconnection layer is disposed along the first surface of the core layer, wherein the ground plane interconnection layer is disposed along the second surface of the core layer substantially parallel to the power plane interconnection layer, and wherein the power plane interconnection layer and the ground plane interconnection layer overlap one another.

14. The package substrate of claim 11, wherein an inner side surface of the EM bandgap cylindrical structure is separated from a side surface of the EM bandgap via by the core layer.

15. The package substrate of claim 11, wherein the EM bandgap via has a blind via structure.

16. The package substrate of claim 15, wherein the blind via structure is a pillar having a round shape in a plan view and a trapezoidal shape in a vertical cross-sectional view.

17. The package substrate of claim 15, wherein a bottom surface of the EM bandgap via is separated from the ground plane interconnection layer by the core layer.

\* \* \* \* \*